(12) United States Patent
Widmayer et al.

(10) Patent No.: US 7,265,985 B2
(45) Date of Patent: Sep. 4, 2007

(54) HEAT SINK AND COMPONENT SUPPORT ASSEMBLY

(75) Inventors: Robert B. Widmayer, Harvard, IL (US); James W. Turocy, Arlington Heights, IL (US); Peter P. Walter, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 251 days.

(21) Appl. No.: 11/025,638

(22) Filed: Dec. 29, 2004

(65) Prior Publication Data

US 2006/0139878 A1    Jun. 29, 2006

(51) Int. Cl.
  *H05K 7/20* (2006.01)
(52) U.S. Cl. ............... 361/721; 361/695; 361/719; 165/80.1; 165/80.3; 174/16.1; 174/16.3
(58) Field of Classification Search ............... None
  See application file for complete search history.

(56) References Cited

U.S. PATENT DOCUMENTS

| | | | |
|---|---|---|---|
| 5,218,516 A * | 6/1993 | Collins et al. ............... 361/721 |
| 6,046,921 A | 4/2000 | Tracewell | |
| 6,151,215 A * | 11/2000 | Hoffman ............... 361/704 |
| 6,434,005 B1 | 8/2002 | Vinciarelli | |
| 6,477,053 B1 | 11/2002 | Zeidan | |
| 6,493,227 B2 | 12/2002 | Nielsen | |
| 6,515,858 B2 | 2/2003 | Rodriguez | |
| 6,538,889 B1 * | 3/2003 | Barsun et al. ............... 361/704 |
| 6,921,328 B1 | 7/2005 | Nohara | |
| 7,068,510 B2 * | 6/2006 | Crippen et al. ............... 361/702 |
| 7,113,405 B2 * | 9/2006 | Armstrong et al. ......... 361/719 |
| 2004/0037040 A1 * | 2/2004 | Yu et al. ............... 361/704 |
| 2004/0190249 A1 | 9/2004 | Hasegawa | |
| 2004/0218367 A1 * | 11/2004 | Lin et al. ............... 361/721 |

* cited by examiner

*Primary Examiner*—Boris Chervinsky
(74) *Attorney, Agent, or Firm*—Valerie M. Davis

(57) ABSTRACT

A heat sink and component support assembly that includes a core structure (110). The core structure (110) includes: a central member (112) having first (114, 116) and second opposing sides; at least one heat dissipating surface (124, 126, 128) extending from at least one of the first opposing sides (114, 116); and first and second extension members (118, 120) positioned adjacent to each of the second opposing sides. The assembly may also include an airflow facilitating arrangement, such as a fan (184), positioned adjacent to the core structure (110) for further enhanced heat dissipating capabilities.

20 Claims, 3 Drawing Sheets

HEAT SINK AND COMPONENT SUPPORT ASSEMBLY

FIELD OF THE INVENTION

The present invention relates generally to heat sink and component support assemblies.

BACKGROUND OF THE INVENTION

Thermal management of electronic devices on printed circuit boards/printed wiring boards is usually accomplished in one or more of three ways: (1) by providing enhanced conduction paths to heat transfer surfaces which are at lower temperatures than the device; (2) by increasing convection (natural or forced) from the surface of the device to a lower temperature surrounding ambient fluid, usually air; or (3) radiation. All three ways provide for the dissipation of heat generated in the electronic devices. Heat dissipation is usually carried out by providing a heat sink assembly comprising individual heat sinks for the various devices. The design and fabrication of the heat sink assembly is therefore dependent upon the size and geometry of the devices. Resultingly, there are often numerous individual parts that make up a heat sink assembly, and many of those numerous parts require individual installation. Moreover, such installation often requires soldering of parts together. Soldering is often done by hand and, therefore, the labor required to produce the heat sink assembly is formidable. In addition to the foregoing, the designs that require significant soldering of individual components also increase the difficulty of and increase required time for repair activity.

Thus, what is needed is a more efficient apparatus for thermal management of electronic devices mounted on circuit boards.

BRIEF DESCRIPTION OF DRAWINGS

A preferred embodiment of the invention is now described, by way of example only, with reference to the accompanying figures in which.

DETAILED DESCRIPTION OF THE INVENTION

Figure 1:
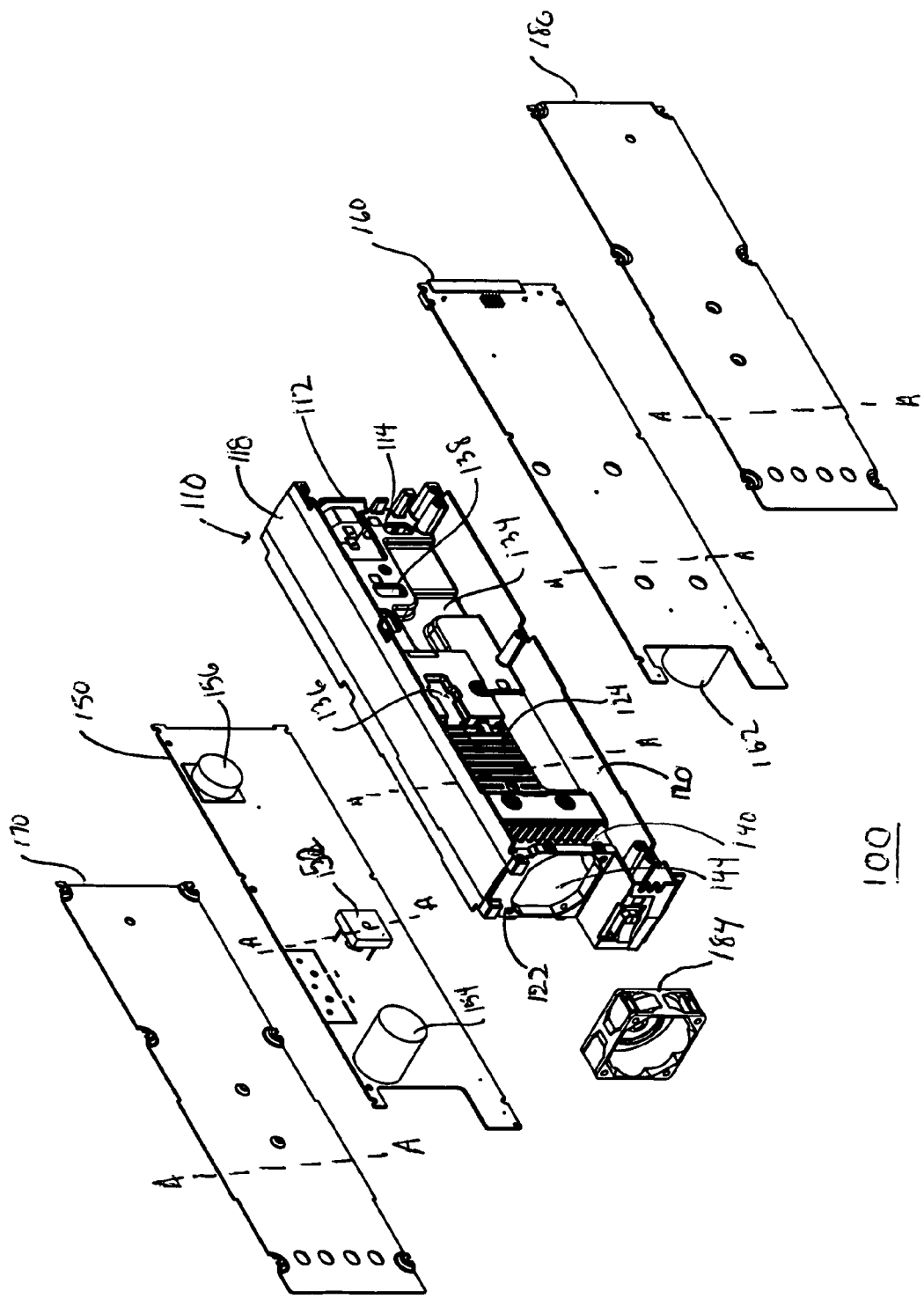
FIG. 1 is an exploded isometric right front view of an apparatus having a heat sink and component support assembly in accordance with an embodiment of the present invention.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, common and well-understood elements that are useful or necessary in a commercially feasible embodiment may not be depicted in order to facilitate a less obstructed view of these various embodiments. Also, elements shown in the figures have not necessarily been drawn to scale. For example, the dimensions of some of the elements are exaggerated relative to each other. Further, where considered appropriate, reference numerals have been repeated among the figures to indicate corresponding elements.

Generally speaking, pursuant to these various embodiments, a heat sink and component support assembly includes a core structure having a central member with first and second opposing sides (e.g., respectively, left and right sides and top and bottom sides). At least one heat dissipating surface extends from one or both of the first opposing sides for use as a heat sinking device to enable the transfer of heat from one or more components (included on a circuit board) that is engaged with the heat dissipating surface. The core structure further includes first and second extension members positioned adjacent to each of the second opposing sides, which are ideally comprised of a heat dissipating material and also used for the thermal management. Also, generally disclosed herein is an airflow facilitating arrangement such as, for instance, a fan that is securely attached to at least one of third opposing sides (e.g., front and back sides). The airflow facilitating arrangement further enhances heat transfer from the heat generating circuit board components by circulating ambient air through the core structure. Moreover, the core structure, with a circuit board or panel securely attached to the left and right sides and the extension members attached to the top and bottom sides further comprises the airflow facilitating arrangement by guiding or channeling ambient air through the core structure. The core structure may include further characteristics such as holes or slots to enable additional ambient airflow through the core structure. The core structure is also typically characterized by at least one profile that is complementary to a profile of a circuit board attached to the core structure.

So configured, the present invention provides an integrated heat sink apparatus and support "chassis" for circuit components and the circuit boards on which they are mounted. The inclusion of the heat dissipating surfaces on the central member of the core structure facilitates heat dissipation without necessitating the soldering of individual heat sinks to a circuit board and/or to the core structure. This provides for ease of disassembly of the device for needed repair. The complementary nature of the central member profile and the profile of a circuit board allows for more efficient use of space within the apparatus so that smaller apparatus may be manufactured having at least the same and usually superior thermal management performance. Inclusion of: the slots and the holes in the core structure; the fan; and the channel coupled to the fan provided by the elements further enhances the heat dissipating properties of the assembly by guiding or channeling ambient air over the circuit components enclosed therein.

It should be appreciated that the above benefits of the present invention are meant only to be exemplary and that additional benefits will be apparent by those skilled in the art. It should be further appreciated that the terms "top" and "bottom", "front" and "back", etc. are utilized merely to aid understanding of the drawings herein and do not indicate a true "upper" or "lower"; "forward" or "rearward" section. The assembly may be inverted, laid on a side or be employed in any other orientation without functionally changing the assembly or departing from the scope of the disclosure herein. It is also to be understood that, although the first and second extension members typically interconnect the top and bottom sides of the core structure in an I-beam configuration, in the foregoing figures, other configurations such as, for instance, a "C" configuration are possible while adhering to the concept of providing heat sink surface area and structural support for circuit components mounted to a circuit board.

Figure 2:
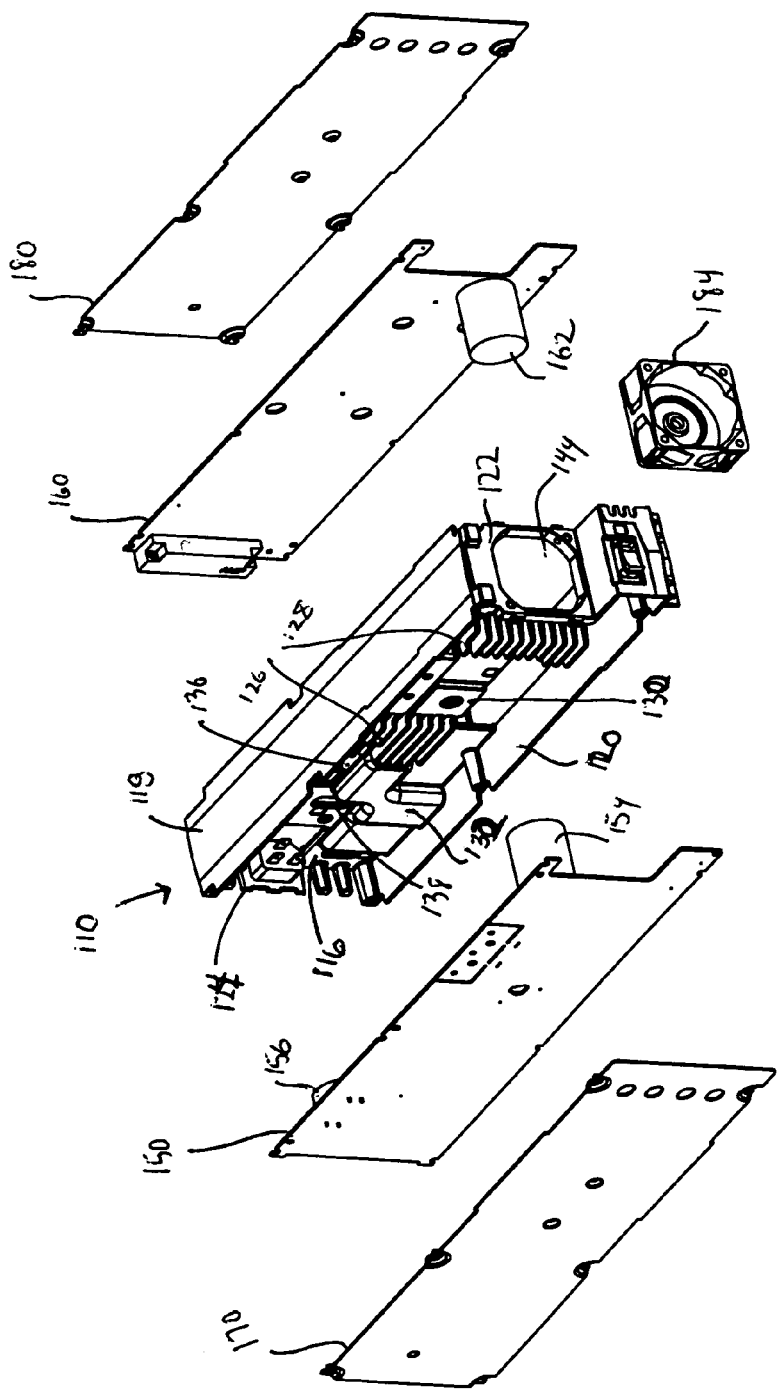
FIG. 2 is an exploded isometric left front view of an apparatus having a heat sink and component support assembly in accordance with an embodiment of the present invention.

Referring now to the drawings, and in particular to FIGS. 1 and 2, an apparatus 100 that includes a heat sink and component support assembly in accordance with various embodiments of the present invention is shown and generally indicated therein. Those skilled in the art, however, will recognize and appreciate that the specifics of this illustrative example are not specifics of the invention itself and that the teachings set forth herein are applicable in a variety of alternative settings. For example, since the teachings described herein do not depend upon what type of device in which the heat sink and support assembly is implemented, they can be applied to any such device such as, for instance, a power supply or a power amplifier. Moreover, since the teachings set forth herein do not depend upon the type of heat dissipating material comprising the heat dissipation surfaces implemented in the present invention, any suitable material may be implemented. In addition, since the teachings set forth herein do not depend on the circuit boards, components and panels attached to the heat sink and support assembly, the assembly can generally be mounted to any such item. As such, alternative implementations using different types and combinations thereof of apparatus 100, heat dissipating material, circuit boards, components and panels are contemplated and are within the scope of the various teachings described.

In the embodiments specifically illustrated in FIG. 1 and FIG. 2, apparatus 100 includes a heat sink and component support assembly comprising a core structure 110. The core structure 110 includes a central member 112 that has or is characterized by first opposing sides/surfaces 114, 116 (e.g., a right and a left side, respectively), second opposing sides/surface (e.g., a top and a bottom side) and third opposing sides/surfaces 122, 124 (e.g., a front side and a back side, respectively). Any one of the first, second and third opposing sides individually or in any combination thereof may comprise a suitable heat dissipating material such as, for instance, aluminum, copper, zinc and the like, thereby enabling those surfaces to serve as heat sink surfaces for dissipating heat from heat-generating components included in the apparatus 100.

The central member 112 includes at least one heat dissipating surface comprising a suitable heat dissipating material that extends from at least one of the right side 114 and the left side 116, e.g., heat dissipating surface 124 extending from the right side 114 and heat dissipating surfaces 126, 128 extending from the left side 116. Any of the heat dissipating surfaces (extending from the central member 112) individually or in any combination thereof may be formed in the central member 112 during a manufacturing process or may be securely attached to the central member 112 using any suitable means, such as, screw(s), rivet(s), and the like. Any of these heat dissipating surfaces (e.g., 124, 126, 128) individually or in any combination thereof may be characterized by the structural features of, for example, fin(s), pin(s), cone(s), plate(s), and the like. Heat dissipating surfaces 124, 126, 128 are illustrated as a plurality of fins. The shape of the fins is not limited to a rectangular plate shape, and may have any desired shape that includes, but is not limited to, square, triangular, circular, other rounded shapes, pin shapes, etc. The fins may not necessarily have to be aligned horizontally or vertically with equal spacing, but may be placed so as to be radial, or oblique relative to the surface from which they extend.

Heat dissipating surfaces, e.g., 124, 126, 128 may be used to provide heat transfer from heat generating circuit components that "engage" with these heat dissipating surfaces. In accordance with the various embodiments of the present invention, a heat generating circuit component 152 is engaged with heat dissipating surfaces 126, 124. In a first instance, component 152 engages with heat dissipating surface 126 by being positioned adjacent to heat dissipating surface 126, ideally, such that the component 152 makes thermal contact with one or more of the fins comprising heat dissipating surface 126, in this instance engaging through physical contact with a thermal contact surface 130 that is formed in or securely attached to the central member 112 (using any suitable means, such as, screw(s), rivet(s), and the like) in a location on side 116 adjacent to one or more of the fins comprising heat dissipating surface 126.

Figure 3:
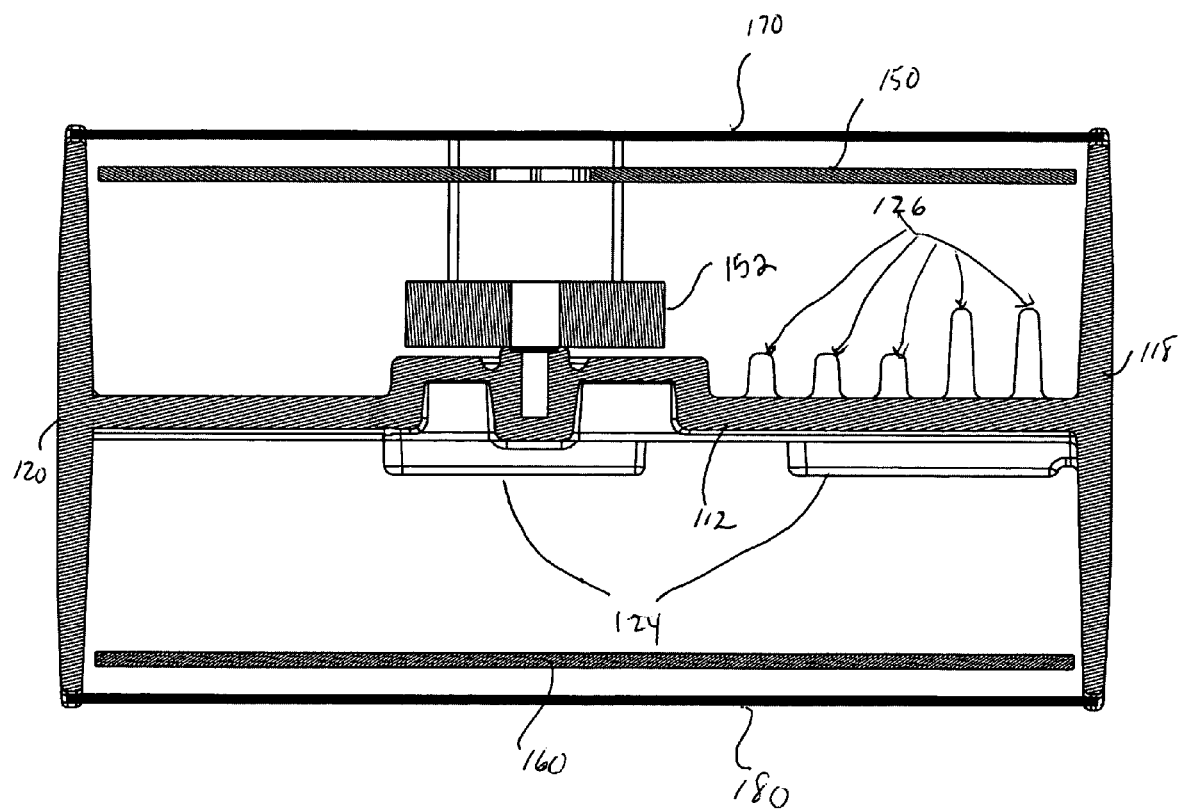
FIG. 3 is a cross-sectional view of the apparatus illustrated in FIG. 1 and FIG. 2.

In a second instance, component 152 engages with heat dissipating surface 124 by making thermal contact with one or more of the fins comprising heat dissipating surface 124, in this instance engaging through physical contact with thermal contact surface 130 in a location on side 116 opposite (e.g., directly behind) one or more of the fins comprising heat dissipating surface 124. FIG. 3 is a cross-sectional through apparatus 100 at a plane AA that illustrates heat dissipating surfaces 124, 126 being engaged with heat generating component 152 for transferring heat from component 152.

It should be apparent by those skilled in the art that configuring the central members with heat dissipating surfaces extending therefrom simplifies the assembly and disassembly of apparatus 100. This is because such a configuration removes the need to solder individual components and/or heat sinks onto the core structure. However, the thermal management configuration of the present invention is at least equivalent to and likely enhanced over thermal management of heat sink configurations in accordance with various embodiment of the prior art.

Turning again to FIGS. 1 and 2, the central member may also be characterized by a "mounting" profile one either or both of its right and left sides, respectively, 114, 116. This mounting profile is ideally structured to be receptive to a complementary profile that characterizes a profile on a circuit board, e.g., 150, 160, that is generally based on the shape and sizes, for instance, of the circuit components (e.g., respectively 152, 154, 156 and 162) mounted thereon. This mounting profile provides support to the circuit components, thereby serving as a chassis, and also enables a more compact assembly of apparatus 100.

The mounting profile may have structural features extending around all or a portion of sides 114, 116. The complementary profile may have complementary structural features that have a size and geometry to correspond to and substantially engage with the structural features of the mounting profile on the core structure 110. Possible structural features and complementary structural features include rib(s), protrusion(s) (e.g., 132), groove(s) (e.g., 134), lip(s), shelve(s), barb(s), spoke(s), hole(s) (e.g., 138, 140), slot(s) (e.g., 136) and the like, as well as combinations comprising at least one of the foregoing features. It should be further noted that the holes, for example hole 140, in the mounting profile may also serve as a "pass-through" for one or more taller components on a circuit board, e.g., components 154 and 162 mounted, respectively, on circuit boards 150 and 160.

The structural features and complementary structural features can exchange positions, i.e., the groove(s) as complementary structural features on the circuit boards 150, 160 and protrusion(s) as structural features on the core structure 110. Such engagement, in some embodiments, may be augmented with mechanical fasteners, such as, screw(s), rivet(s), and the like. Optionally, the protrusion(s) and the groove(s) can be threaded such that the protrusion(s) are threadably engaged to the groove(s).

Core structure 110 further comprises first and second extension members 118, 120 formed in or ideally securely attached to the top and bottom sides of the central member 112 using any suitable means, such as, screw(s), rivet(s), and the like. Either the first or second extension members or both may comprise a suitable heat dissipating material, for instance as identified above, thereby enabling those surfaces to serve as heat sink surfaces for dissipating heat from heat-generating components included in the apparatus 100.

Either or both of the first and second extension members 118,120 may further include at least one heat dissipating surface comprising a suitable heat dissipating material that extends therefrom. These heat dissipating surfaces individually or in any combination thereof may be formed in the extension member during a manufacturing process or may be securely attached to the extension member using any suitable means, such as, screw(s), rivet(s), and the like. Moreover, any of these heat dissipating surfaces individually or in any combination thereof may be characterized by the structural features of, for example, fin(s), pin(s), cone(s), plate(s), and the like. The shape of the heat dissipating surfaces is not limited to a rectangular plate shape, and may have any desired shape that includes, but is not limited to, square, triangular, circular, other rounded shapes, pin shapes, etc. The heat dissipating surfaces may not necessarily have to be aligned horizontally or vertically with equal spacing, but may be placed so as to be radial, or oblique relative to the surface from which they extend.

The heat sink and component support assembly of apparatus 100 further comprises an airflow-facilitating arrangement positioned adjacent to the core structure 110. As illustrated in this embodiment, the airflow-facilitating arrangement includes a fan 184 that is mounted on the front surface 122 of the central member 112. The front surface 122 may comprise posts to mount the fan 184. Suitable fasteners (screw(s), rivet(s), and the like) may be inserted through holes in the housing of the fan 184 and into posts in the front surface 122 to mount the fan 184 thereon. The fan 184 rotates and facilitates airflow by causing environmental air (presumably air at a temperature lower than the air inside the heat sink assembly) to flow between and around the fins 124, 126, 128, heat sink surfaces and the heat generating components 152, in a heat exchanging fashion.

The heat sink assembly included in apparatus 100 may further include one or more panels (e.g., 170, 180) for covering at least one surface on central member 112. Desirably, a pair of side panels 170, 180 is provided for covering the circuit boards 150, 160, that are respectively attached to side surfaces 114, 116. Front surface 122 also desirably includes a front panel for covering all or part of the front surface 122. As illustrated in this embodiment, the front panel comprises an airflow section 144, such that the fan 184 has access to environmental air, i.e., air outside the heat sink assembly. Optionally the heat sink assembly may further comprise one or more insulators (not shown) between the panels 170, 180 and the circuit boards 150, 160.

Two circuit boards and two side panels are illustrated. However, those skilled in the art will realize that apparatus 100 may include more or fewer circuit boards and/or side panels attached to core structure 110. For example, apparatus 100 may include a single circuit board attached to side 116 and a side panel attached directly to the other side of 114. In these various embodiments, it should be readily apparent to one of ordinary skill in the art that various combinations of the circuit boards and side panels being attached to sides 114, 116 in combination with extension members 118, 120 further comprise the airflow facilitating arrangement in that these elements serve as a channel for guiding air over the heat sinking surfaces of core structure 110 and the heat generating components.

The core structure 110 may further include an air connect area that enhances heat dissipation. The air connect area may be an area having a plurality of air connect holes (not shown), for example, present on the top extension member 118 and/or the bottom extension member 120, such that there is entry of air from outside the core structure 110 into the core structure 110 and exit of air inside the core structure 110 to outside the core structure 110.

The heat-generating component 152 may be mounted on a printed circuit board comprising electronic components. Only a few components are shown mounted on circuit boards 150 and 160 for ease of illustration. However, those skilled in the art will realize that many more components, including additional heat generating components are mounted thereon in a typical implementation. Possible electronic components include, but are not limited to, transistors, diodes, a CPU socket, a variety of memory (sockets), a chipset; a variety of die up electronic components; a variety of die down electronic components; and the like, and combinations comprising at least one of the foregoing.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

We claim:

1. A heat sink and component support assembly comprising:
   a core structure comprising:
      a central member having first and second opposing sides;
      a plurality of parallel heat dissipating fins extending from each of the first opposing sides; and
   first and second extension members positioned adjacent to each of the second opposing sides.

2. The assembly of claim 1, wherein the plurality of heat dissipating fins are formed in each of the first opposing sides.

3. The assembly of claim 1, wherein the plurality of heat dissipating fins are securely attached to each of the first opposing sides.

4. The assembly of claim 1, further comprising at least one heat dissipating surface extending from at least one of the first opposing sides, wherein the at least one heat dissipating surface is selected from the group comprising: pins, cones, and plates.

5. The assembly of claim 1 further comprising an airflow facilitating arrangement positioned adjacent to the core structure.

6. The assembly of claim 5, wherein the central member having third opposing sides and the airflow facilitating arrangement comprising a fan positioned adjacent to one of the third opposing sides.

7. The assembly of claim 6, wherein the airflow facilitating arrangement further comprises the first and second extension members and at least one of a circuit board and a panel securely attached to the core structure.

8. The assembly of claim 1, wherein at least one of the first opposing sides is characterized by a first profile.

9. The assembly of claim 8, wherein the first profile has at least one of: at least one slot; at least one groove; at least one hole; and at least one protrusion.

10. The assembly of claim 8, wherein the first profile is a complementary profile to a second profile of a circuit board having electrical components mounted thereon.

11. The assembly of claim 1, wherein the core structure has an I-beam configuration.

12. The assembly of claim 1, wherein the central member includes at least one thermal contact surface, for engaging a heat generating component, wherein the at least one thermal contact surface is positioned opposite the plurality of heat dissipating fins on one of the first opposing sides and is positioned adjacent to the other of the first opposing sides.

13. The assembly of claim 1, wherein the central member includes at least one thermal contact surface, for engaging a heat generating component, wherein the at least one thermal contact surface is positioned adjacent to the plurality of heat dissipating fins on one of the first opposing sides.

14. The assembly of claim 1, wherein at least one of the extension members includes at least one heat dissipating surface extending therefrom.

15. The assembly of claim 1, wherein at least one of the extension members comprises a heat dissipating material.

16. The assembly of claim 1, wherein at least one of the extension members has at least one of: a slot; a groove; a hole; and a protrusion.

17. A heat sink and component support assembly comprising:
a core structure comprising:
a central member having first, second and third opposing sides;
a plurality of parallel heat dissipating fins extending from each of the first opposing sides; and
first and second extension members positioned adjacent to each of the second opposing sides; and
an airflow facilitating arrangement comprising a fan positioned adjacent to one of the third opposing sides.

18. The assembly of claim 17, wherein at least one of the first opposing sides is characterized by a first profile that is a complementary profile to a second profile of a circuit board having electrical components mounted thereon.

19. An apparatus comprising:
a core structure comprising:
a central member having first, second and third opposing sides;
a plurality of parallel heat dissipating fins extending from each of the first opposing sides; and
first and second extension members positioned adjacent to each of the second opposing sides;
at least one circuit board having components mounted thereon positioned adjacent to at least one of the first opposing sides; and
an airflow facilitating arrangement comprising a fan positioned adjacent to one of the third opposing sides.

20. The apparatus of claim 19, wherein the apparatus is included in a device selected from the group comprising a power supply and a power amplifier.

* * * * *